(12) United States Patent
Yamada et al.

(10) Patent No.: US 10,747,093 B2
(45) Date of Patent: Aug. 18, 2020

(54) JOINED BODY, METHOD FOR PRODUCING JOINED BODY, AND PROJECTOR

(71) Applicant: Seiko Epson Corporation, Tokyo (JP)

(72) Inventors: Yohei Yamada, Chino (JP); Hideo Miyasaka, Okaya (JP); Hideo Imai, Shimosuwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/268,817

(22) Filed: Feb. 6, 2019

(65) Prior Publication Data

US 2019/0243224 A1 Aug. 8, 2019

(30) Foreign Application Priority Data

Feb. 7, 2018 (JP) ................................. 2018-019860

(51) Int. Cl.
| | |
|---|---|
| *B23K 1/00* | (2006.01) |
| *B32B 5/16* | (2006.01) |
| *B32B 9/04* | (2006.01) |
| *G03B 21/16* | (2006.01) |
| *G03B 21/20* | (2006.01) |
| *C09K 11/77* | (2006.01) |
| *F21V 9/30* | (2018.01) |
| *H01L 23/482* | (2006.01) |
| *B23K 20/02* | (2006.01) |
| *H01L 23/495* | (2006.01) |

(52) U.S. Cl.
CPC .......... *G03B 21/204* (2013.01); *B23K 1/0008* (2013.01); *B23K 20/026* (2013.01); *B32B 5/16* (2013.01); *B32B 9/04* (2013.01); *C09K 11/7706* (2013.01); *C09K 11/7721* (2013.01); *F21V 9/30* (2018.02); *G03B 21/16* (2013.01); *H01L 23/4828* (2013.01); *H01L 23/49568* (2013.01); *B32B 2264/105* (2013.01); *B32B 2307/422* (2013.01)

(58) Field of Classification Search
CPC ................................. G03B 21/204; F21V 9/30
See application file for complete search history.

(56) References Cited

U.S. PATENT DOCUMENTS

| | | | |
|---|---|---|---|
| 2013/0194777 A1* | 8/2013 | Berben | F21V 13/00 362/84 |
| 2014/0233210 A1* | 8/2014 | Owada | F21V 29/505 362/84 |
| 2016/0240505 A1 | 8/2016 | Tatsumi et al. | |
| 2019/0006268 A1* | 1/2019 | Sugiura | H01L 24/08 |

FOREIGN PATENT DOCUMENTS

| | | |
|---|---|---|
| JP | 2014-029897 A | 2/2014 |
| JP | 2015-093295 A | 5/2015 |

* cited by examiner

*Primary Examiner* — Alexander K Garlen
*Assistant Examiner* — Eric T Eide
(74) *Attorney, Agent, or Firm* — Harness, Dickey & Pierce, P.L.C.

(57) ABSTRACT

A joined body includes a first substrate, a second substrate which faces the first substrate, and a joining film which joins the first substrate to the second substrate, wherein the joining film has a first region and a second region, and in a plan view of the first substrate, the first region has a higher metal nanoparticle density than the second region.

7 Claims, 12 Drawing Sheets

JOINED BODY, METHOD FOR PRODUCING JOINED BODY, AND PROJECTOR

BACKGROUND

1. Technical Field

The present invention relates to a joined body, a method for producing a joined body, and a projector.

2. Related Art

JP-A-2015-93295 (Patent Document 1) discloses a method for forming a joined body by joining a first substrate to a second substrate using metal nanoparticles. According to this method, the joined body is formed by stacking a film composed of metal nanoparticles, a metal foil, a film composed of metal nanoparticles, and a second substrate in this order on a first substrate. The metal nanoparticles are metal particles having a particle diameter of 1 nm to 100 nm. The metal nanoparticles have a high bonding property and can bond the substrates to each other at a far lower temperature than the melting point of a metal constituting the metal nanoparticles. Then, the structural strength of the joined body is maintained until reaching around the melting point of the metal. Therefore, the metal nanoparticles are also used as a joining material. By performing heating and firing in a state where a film composed of metal nanoparticles is interposed between a first substrate and a second substrate, the first substrate and the second substrate are joined to each other. As the metal constituting the metal nanoparticles, Ag is mainly used, and other than this, Au, Cu, Ni, or the like is used.

The metal foil sandwiched between the first substrate and the second substrate is a metal which contains aluminum and has excellent ductility. Even if the first substrate and the second substrate have different thermal expansion coefficients, the occurrence of a crack between the first substrate and the second substrate is suppressed by elongation of the metal foil. Further, by using Ni as the metal constituting the metal nanoparticles, a highly reliable joined state is obtained even at a high temperature of 350° C. or higher.

In a light source of a projector, the above-mentioned joined body is used as an optical element which irradiates laser light on the second substrate having a phosphor applied thereto and converts the wavelength. The second substrate is a substrate having heat resistance, and the first substrate is a substrate having a heat dissipation property. The joined body transfers the heat of the second substrate to the first substrate to suppress an increase in the temperature of the second substrate. Therefore, it is necessary to enhance the heat transfer property between the substrates.

The optical element is designed to be small and thin for miniaturizing the projector. By thinning the second substrate, the heat capacity of the second substrate is reduced so that the heat of the phosphor is easily transferred to the first substrate. As the second substrate, a ceramic substrate having heat resistance is used. Therefore, the second substrate is susceptible to stress due to an impact load.

In the joined body disclosed in Patent Document 1, a thin metal foil and a film composed of metal nanoparticles are mounted between the first substrate and the second substrate. The joined body is in a state where there is no difference in the particle density of the metal nanoparticles in the film composed of the metal nanoparticles among sites. Then, in a step before heating the film composed of the metal nanoparticles, the film composed of the metal nanoparticles and the second substrate are mounted in a stacked manner on the first substrate. When the particle density of the metal nanoparticles constituting the film is high, an impact load when the second substrate is mounted is applied to the first substrate and the second substrate, and therefore, a risk that the first substrate and the second substrate are damaged is high.

When the particle density of the metal nanoparticles constituting the film is low, an impact load when the second substrate is mounted is relieved by the film composed of the metal nanoparticles, and therefore, a risk that the first substrate and the second substrate are damaged can be suppressed. However, when the particle density in the film composed of the metal nanoparticles is low, there is a problem that the heat transfer property between substrates is deteriorated. Therefore, a joined body which has a good heat transfer property between substrates and can relieve stress due to an impact load has been demanded.

SUMMARY

An advantage of some aspects of the invention is to solve the above-mentioned problem and the invention can be implemented as the following forms or application examples.

Application Example 1

A joined body according to this application example includes a first substrate, a second substrate which faces the first substrate, and a joining film which joins the first substrate to the second substrate, wherein the joining film includes a plurality of types of metal nanoparticles, and the joining film has a first region and a second region, and in a plan view of the first substrate, the first region has a higher metal nanoparticle density than the second region.

According to this application example, the joined body includes a first substrate and a second substrate. The first substrate and the second substrate are joined to each other with a joining film which includes a plurality of types of metal nanoparticles. The joining film has a first region and a second region. The first region has a higher metal nanoparticle density than the second region. Heat transfer occurs between the metal nanoparticles, and therefore, a region having a high metal nanoparticle density has a better heat transfer property than a region having a low metal nanoparticle density. Since the density of the metal nanoparticles in the first region is high, the first region is a region having a good heat transfer property.

Since the second region has a low metal nanoparticle density, the metal nanoparticles easily move in the second region in a step before firing. Therefore, when an impact load is applied between the first substrate and the second substrate, the stress can be relieved by moving the metal nanoparticles in the second region. As a result, the joined body can enhance the heat transfer property between the substrates and also can relieve the stress due to the impact load.

Application Example 2

In the joined body according to the above application example, it is preferred that the first region is disposed in the center of the second substrate and the second region is disposed around the first region.

According to this application example, the first region is disposed in the center of the second substrate. The first region has a high metal nanoparticle density, and therefore is a region having a good heat transfer property. The heat of the second substrate is transferred to the first substrate mainly through the first region. The heat of the second substrate in the second region is partially transferred in the metal nanoparticles in the second region. Further, the heat of the second substrate in the second region is partially transferred in the second substrate and then transferred to the first substrate through the metal nanoparticles in the first region. Accordingly, in the second substrate, heat in a place where a distance from the first region is short reaches the first region early, and therefore, the heat is transferred early. Then, in the second substrate, heat in a place where a distance from the first region is long reaches the first region late, and therefore, the heat is transferred late.

When the first region is located in the center of the second substrate, as compared with the case where the first region is located at an end of the second substrate, a distance between a place on the second substrate far from the first region and the first region can be made short. Then, the heat in the second region of the second substrate can be prevented from being transferred late. Therefore, a variation in the temperature distribution in the second substrate can be reduced.

Application Example 3

In the joined body according to the above application example, it is preferred that in a plan view of the first substrate, the joining film projects from at least a part of the periphery of the second substrate, and in the second substrate, the joining film is not mounted on an upper face which is a face on the opposite side to the first substrate side.

According to this application example, in a plan view of the first substrate, the joining film projects from at least a part of the periphery of the second substrate. The heat of the second substrate is transferred to the first substrate through the joining film. Therefore, the joining film projecting from the periphery of the second substrate also transfers heat. Accordingly, as compared with the case where the joining film does not project from the periphery of the second substrate, heat can be efficiently transferred.

The joining film is not mounted on the upper face of the second substrate. This upper face is a face on the opposite side to the first substrate side. The joining film includes metal nanoparticles, and therefore has electrical conductivity. In this application example, the joining film is not mounted on the upper face of the second substrate, and therefore, the occurrence of an electrical defect due to the joining film can be suppressed. Further, an unevenness is formed on the surface in a place where the joining film is mounted. Since the joining film is not mounted on the upper face of the second substrate in this application example, the occurrence of a defect due to the unevenness of the joining film can be suppressed.

Application Example 4

In the joined body according to the above application example, it is preferred that in the first substrate, a first groove is provided along the outer periphery of the first region, and a second groove is provided along the outer periphery of the second region.

According to this application example, in the first substrate, a first groove is provided along the outer periphery of the first region. The material of the joining film is in a liquid form. When the material of the joining film to be mounted in the first region is applied to the first substrate, the material of the joining film spreads on the first substrate. At this time, since the first groove is provided along the outer periphery of the first region, when the material of the joining film reaches the first groove, the material of the joining film enters the first groove. Therefore, the spread of the material of the joining film across the first groove can be reduced.

Similarly, in the first substrate, a second groove is provided along the outer periphery of the second region. When the material of the joining film to be mounted in the second region is applied to the first substrate, the material of the joining film spreads on the first substrate. At this time, since the second groove is provided along the outer periphery of the second region, when the material of the joining film reaches the second groove, the material of the joining film enters the second groove. Therefore, the spread of the material of the joining film across the second groove can be reduced. As a result, the joining film can be disposed in the first region and the second region in high quality.

Application Example 5

A method for producing a joined body according to this application example includes placing a paste including a plurality of types of metal nanoparticles on one face of a first substrate or a second substrate, sandwiching the paste between the first substrate and the second substrate, and firing the paste, wherein the paste includes a first paste and a second paste having a lower metal nanoparticle density than the first paste, and when the paste is placed, the second paste is placed around the first paste in a plan view of the first substrate or the second substrate.

According to this application example, a paste including metal nanoparticles is placed on one face of a first substrate or a second substrate. Then, the paste is sandwiched between the first substrate and the second substrate. Then, the paste is fired. The metal nanoparticles have a small particle diameter and are fine, and therefore have a high bonding property, and the particles are joined to one another at a lower temperature than the melting point of the metal constituting the metal nanoparticles. Accordingly, the first substrate and the second substrate can be bonded to each other by firing the paste containing the metal nanoparticles.

The paste includes a first paste and a second paste. The first paste has a high metal nanoparticle density, and the second paste has a low metal nanoparticle density. That is, the first paste has a higher metal nanoparticle density than the second paste. Heat conduction occurs by transferring heat between the metal nanoparticles, and therefore, a place where the paste having a high metal nanoparticle density is fired has a better heat transfer property than a place where the paste having a low metal nanoparticle density is fired. The place where the first paste is fired is defined as a first region, and the place where the second paste is fired is defined as a second region. At this time, the first region has a high metal nanoparticle density, and therefore, the first region becomes a place having a better heat transfer property than the second region.

In a plan view of the second substrate, the second paste is placed around the first paste. Therefore, the second region is placed around the first region. The heat of the second substrate is easily transferred to the first substrate through the first region. Therefore, in the second substrate, heat in a place near the first region is easily transferred to the first substrate, and heat in a place far from the first region is less easily transferred to the first substrate. When the first region is located on the inside of the second region, as compared with the case where the first region is located at an end of the second region, the distance of a place far from the first region can be made short. Therefore, a variation in the temperature distribution in the second substrate can be reduced.

Since the second paste has a low metal nanoparticle density, the metal nanoparticles easily move in the second paste before firing. Therefore, when an impact load is applied between the first substrate and the second substrate, the stress can be relieved by moving the metal nanoparticles in the second paste. As a result, the joined body can enhance the heat transfer property and also can relieve the stress due to the impact load.

Application Example 6

A projector according to this application example includes a light source and a wavelength conversion section which converts the wavelength of light emitted from the light source, wherein the wavelength conversion section is a joined body in which a first substrate that dissipates heat and a second substrate that has a phosphor are joined to each other with a joining film, and as the wavelength conversion section, the joined body according to any of the above application examples is used.

According to this application example, the projector includes a light source and a wavelength conversion section. The wavelength conversion section converts the wavelength of light emitted from the light source. The wavelength conversion section is a joined body in which a first substrate that dissipates heat and a second substrate that has a phosphor are joined to each other with a joining film. When light is irradiated on the phosphor, the phosphor emits light. At this time, by emitting light having a different wavelength from that of the irradiated light, the wavelength is converted.

The temperature of the second substrate is increased by the irradiated light. Then, the temperature of the second substrate is maintained at a moderate temperature by transferring heat from the second substrate to the first substrate. As the wavelength conversion section, the above-mentioned joined body is used. The above-mentioned joined body is a joined body which has a good heat transfer property and also can relieve stress due to an impact load. Therefore, the wavelength conversion section can reliably suppress an excessive increase in the temperature. The wavelength conversion section can relieve stress due to an impact load, and therefore, even if an impact is applied thereto in the production process, it is hardly broken, and thus, the wavelength conversion section can be easily produced. As a result, the projector can be configured as a device including a wavelength conversion section which can reliably suppress an excessive increase in the temperature and is easily produced.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments will be described with reference to the drawings. Incidentally, in order to make the respective members in the respective drawings have a recognizable size, the reduction scale is made different for each member.

First Embodiment

Figure 1:
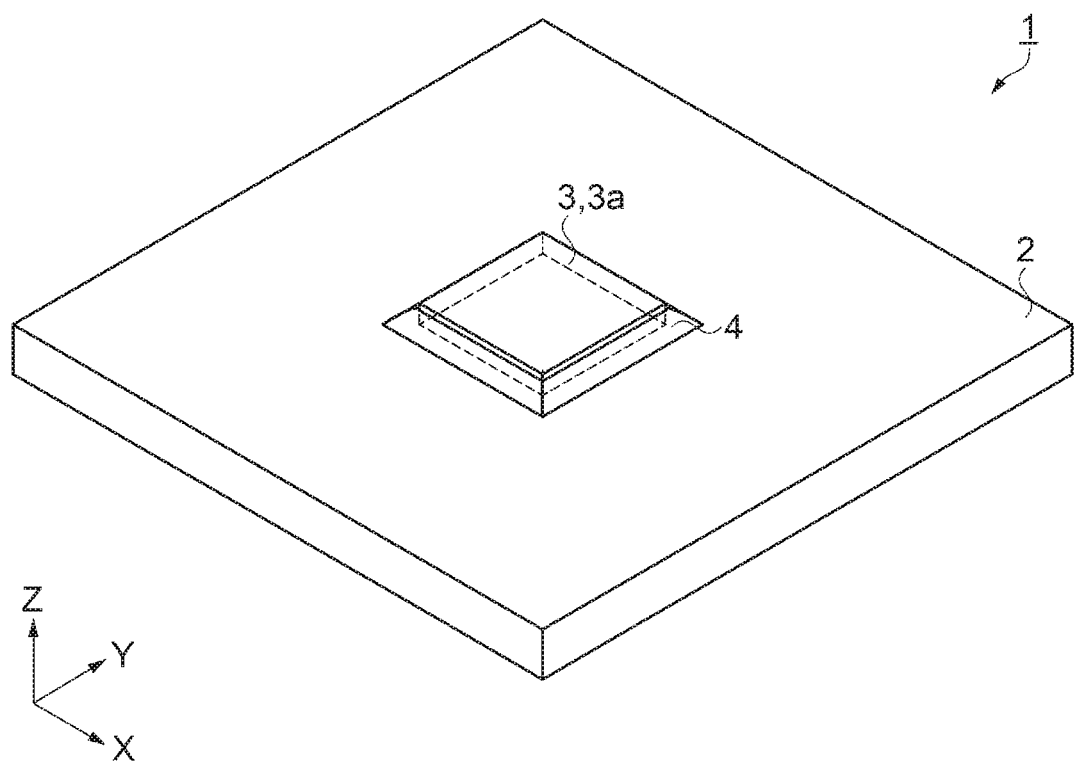
FIG. 1 is a schematic perspective view showing a structure of a phosphor element according to a first embodiment.

In this embodiment, characteristic examples of a phosphor element and a method for producing this phosphor element will be described with reference to the drawings. A phosphor element according to a first embodiment will be described with reference to FIGS. 1 to 4. FIG. 1 is a schematic perspective view showing a structure of the phosphor element. As shown in FIG. 1, a phosphor element 1 as a joined body includes a first substrate 2 in a quadrangular form. The first substrate 2 is a plate having a quadrangular planar shape. The directions in which two adjacent sides of the quadrangle of the first substrate 2 extend are defined as "X direction" and "Y direction". The thickness direction of the first substrate 2 is defined as "Z direction". The X direction, the Y direction, and the Z direction are orthogonal to one another. In the center of the first substrate 2, a second substrate 3 is mounted facing the first substrate 2. The second substrate 3 is also a plate having a quadrangular planar shape. The first substrate 2 and the second substrate 3 are joined to each other with a joining film 4.

The second substrate 3 has a phosphor. In this embodiment, for example, the second substrate 3 is all composed of a phosphor. An upper face 3a of the second substrate 3 is a face on the opposite side to the first substrate 2 side in the second substrate 3. The property of the second substrate 3 is not particularly limited, however, in this embodiment, for example, when blue light is irradiated on the second substrate 3, the second substrate 3 emits yellow light. The second substrate 3 is an optical member which emits light by being excited by light from an ultraviolet light range to a blue light range.

As phosphor particles, a rare-earth phosphor, a SiAlON phosphor, or the like is used. Specifically, as the rare-earth phosphor, for example, $Y_3Al_5O_{12}$:Ce (YAG (Yttrium Aluminum Garnet):Ce) is used, and as the SiAlON phosphor, for example, α-SiAlON is used. As a base material, a sintered body in which alumina or the like is mixed, a glass, or a resin can be used. As the phosphor, a material obtained by internally including phosphor particles in the base material can be used. Further, as the phosphor, a sintered body composed only of phosphor particles or the like can also be used.

When light is irradiated on the second substrate 3, the upper face 3a of the second substrate 3 is heated. When the temperature of the second substrate 3 is increased, the second substrate 3 is discolored, and therefore, the light reflection efficiency is lowered. When the second substrate 3 is thick, heat is confined in the second substrate 3, and therefore, the second substrate 3 is easily discolored. By thinning the second substrate 3, the second substrate 3 has a structure in which heat is easily transferred to the first substrate 2 from the upper face 3a of the second substrate 3.

The material of the first substrate 2 is preferably a material having rigidity and a heat transfer property, and for example, a metal containing copper, aluminum, or the like can be used as the material of the first substrate 2. In this embodiment, for example, copper or a copper alloy is used as the material of the first substrate 2. The size of the first substrate 2 is not particularly limited, however, in this embodiment, for example, the side length is from 10 mm to 20 mm, and the thickness is from 0.1 mm to 3 mm.

The joining film 4 is a film obtained by firing silver nanoparticles. The joining film 4 projects from the periphery of the second substrate 3 in a plan view of the first substrate 2. In this embodiment, the joining film 4 projects from the entire periphery of the second substrate 3. A portion from which the joining film 4 projects may be the entire periphery or a part of the periphery of the second substrate 3. On the upper face 3a of the second substrate 3, the joining film 4 is not mounted.

By the light irradiated on the second substrate 3, the second substrate 3 is heated. By transferring the heat of the second substrate 3 to the first substrate 2, the second substrate 3 is cooled. The heat of the second substrate 3 is transferred to the first substrate 2 through the joining film 4. Therefore, also the joining film 4 projecting from the periphery of the second substrate 3 transfers heat. Accordingly, as compared with the case where the joining film 4 does not project from the periphery of the second substrate 3, the joining film 4 can efficiently transfer heat between the second substrate 3 and the first substrate 2.

On the upper face 3a of the second substrate 3, the joining film 4 is not mounted. The joining film 4 includes silver nanoparticles, and therefore has electrical conductivity. Since the joining film 4 is not mounted on the upper face 3a of the second substrate 3 in the phosphor element 1, the occurrence of an electrical defect due to the joining film 4 can be suppressed. Further, an unevenness is formed on the surface in a place where the joining film 4 is mounted. Since the joining film 4 is not mounted on the upper face 3a of the second substrate 3 in the phosphor element 1, the occurrence of a defect due to the unevenness of the joining film 4 can be suppressed.

Figure 2:
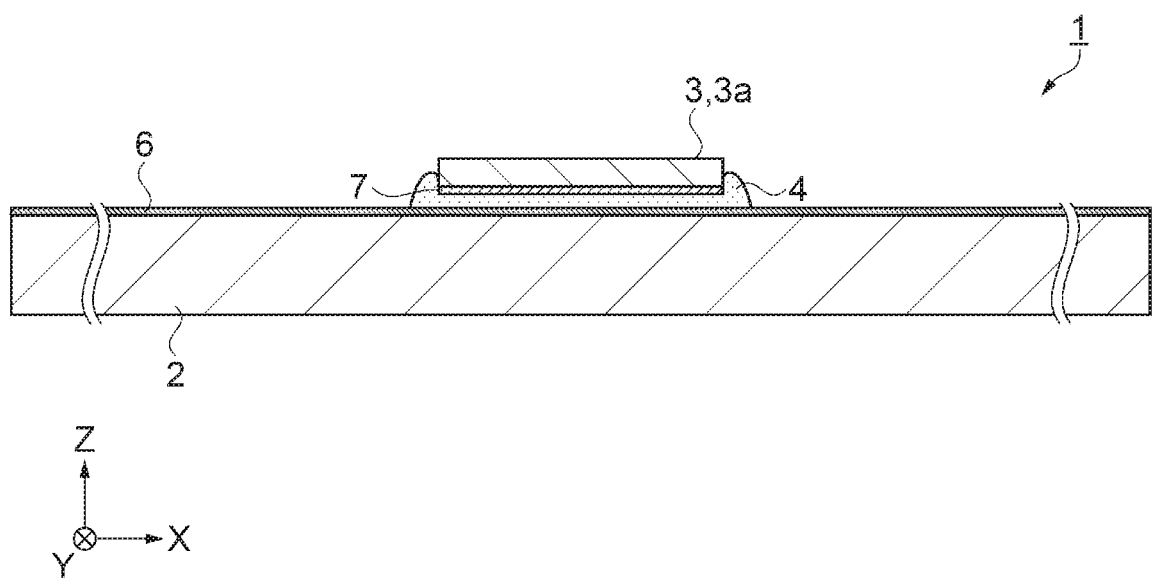
FIG. 2 is a schematic side cross-sectional view showing a structure of the phosphor element.

FIG. 2 is a schematic side cross-sectional view showing a structure of the phosphor element. As shown in FIG. 2, on the first substrate 2, a first auxiliary film 6 is mounted on a face on the +Z direction side. The first auxiliary film 6 assists the joining film 4 to join to the first substrate 2. That is, by mounting the first auxiliary film 6, the joining film 4 easily joins to the first substrate 2. The material of the first auxiliary film 6 is chromium and gold and the first auxiliary film 6 is mounted using a plating method.

Also on the second substrate 3, a second auxiliary film 7 is mounted on a face on the −Z direction side. The second auxiliary film 7 assists the joining film 4 to join to the second substrate 3. That is, by mounting the second auxiliary film 7, the joining film 4 easily joins to the second substrate 3. The material of the second auxiliary film 7 is silver and the second auxiliary film 7 is mounted using a vapor deposition method.

Figure 3:
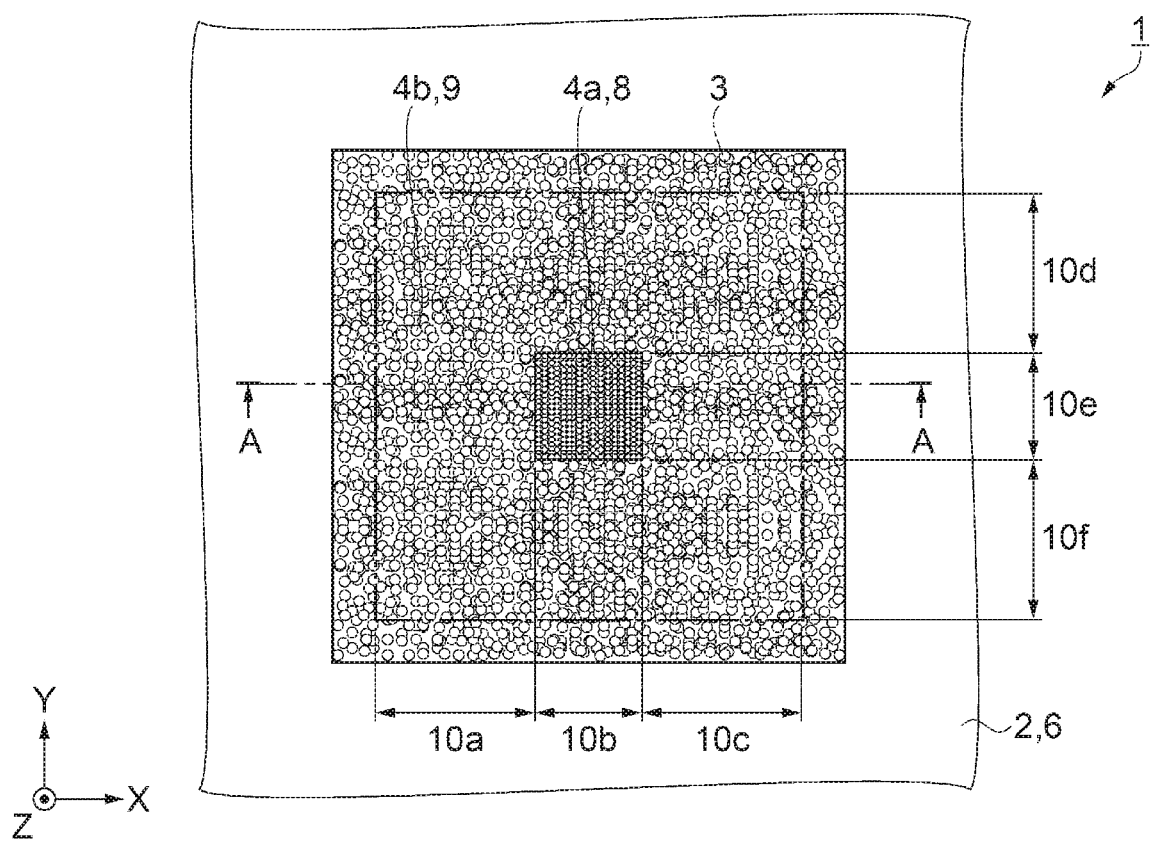
FIG. 3 is a schematic plan view showing a structure of a joining film.
Figure 4:
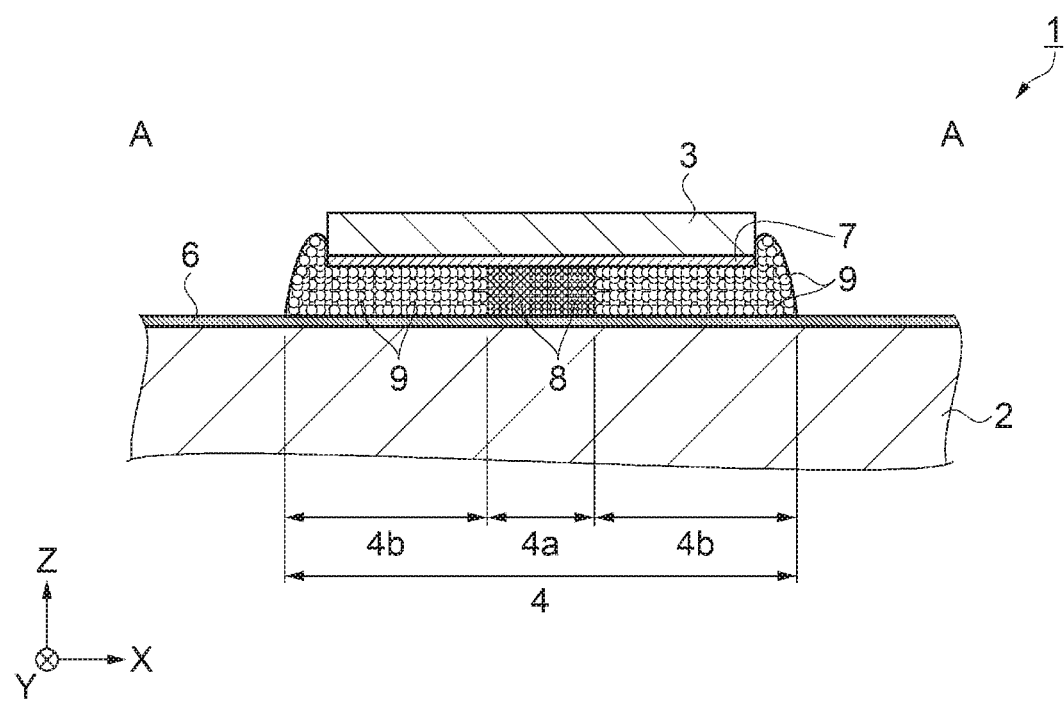
FIG. 4 is a schematic side cross-sectional view showing a structure of the joining film.

FIG. 3 is a schematic plan view showing a structure of the joining film, and FIG. 4 is a schematic side cross-sectional view showing a structure of the joining film. FIG. 3 is a view in which the second substrate 3 of the phosphor element 1 is omitted. FIG. 4 is a view when viewing the cross section taken along the line A-A in FIG. 3 from the −Y direction side. As shown in FIGS. 3 and 4, the joining film 4 has a first region 4a and a second region 4b. In the first region 4a, many first particles 8 are placed, and in the second region 4b, many second particles 9 are placed. The average particle diameter of the first particles 8 is from 10 nm to 60 nm, and the average particle diameter of the second particles 9 is from 60 nm to 100 nm. The average particle diameter refers to the average of the particle diameter. The first particles 8 and the second particles 9 are metal nanoparticles having different particle diameters. In this manner, the joining film 4 includes a plurality of types of metal nanoparticles having different particle diameters. Specifically, the joining film 4 includes two types of metal nanoparticles having different particle diameter distributions. As the particle diameter is smaller, a gap between the particles is smaller. Therefore, in a plan view of the first substrate 2, the first region 4a has a higher metal nanoparticle density than the second region 4b. As the metal of the metal nanoparticles, silver, gold, silver-palladium, copper, silver-copper, or the like is used. In this embodiment, for example, silver is used as the metal of the metal nanoparticles.

Heat transfer occurs between the first particles 8 and between the second particles 9, and therefore, the first region 4a having a high metal nanoparticle density has a better heat transfer property than the second region 4b having a low metal nanoparticle density. The first region 4a has a high metal nanoparticle density, and therefore is a region having a good heat transfer property.

In the production process, the metal nanoparticles are mixed with a solvent to form a paste and applied to the first substrate 2. Thereafter, on the paste including the metal nanoparticles, the second substrate 3 is mounted. Subsequently, the paste is fired, whereby the joining film 4 is formed. When the second substrate 3 is mounted, the second substrate 3 is sucked and stuck to a specialized tool and then placed on the first substrate 2. At this time, an impact load may be applied to the second substrate 3.

The second region 4b has a low density of the second particles 9. In the second region 4b in the step before firing, the second particles 9 easily move. Therefore, when an impact load is applied between the first substrate 2 and the second substrate 3, the stress can be relieved by moving the second particles 9 in the second region 4b. As a result, the joining film 4 can enhance the heat transfer property and also can relieve stress due to an impact load.

As shown in FIG. 3, the length in the X direction from the end on the −X direction side of the second substrate 3 to the end on the −X direction side of the first region 4a is defined as a first length 10a. The width of the first region 4a in the X direction is defined as a second length 10b. The length in the X direction from the end on the +X direction side of the second substrate 3 to the end on the +X direction side of the first region 4a is defined as a third length 10c. At this time, the first length 10a and the third length 10c are the same. The first length 10a and the second length 10b are substantially the same.

Similarly, the length in the Y direction from the end on the +Y direction side of the second substrate 3 to the end on the +Y direction side of the first region 4a is defined as a fourth length 10d. The width of the first region 4a in the Y direction is defined as a fifth length 10e. The length in the Y direction from the end on the −Y direction side of the second substrate 3 to the end on the −Y direction side of the first region 4a is defined as a sixth length 10f. At this time, the fourth length 10d and the sixth length 10f are the same. The fourth length 10d and the fifth length 10e are substantially the same.

Therefore, the first region 4a is disposed in the center of the second substrate 3, and the second region 4b is disposed around the first region 4a. The first region 4a has a high density of the first particles 8 and therefore is a region having a good heat transfer property. The heat of the second substrate 3 is transferred to the first substrate 2 through the first region 4a. The heat of the second substrate 3 in the second region 4b is partially transferred in the second particles 9 in the second region 4b. Further, the heat of the second substrate 3 in the second region 4b is partially transferred in the second substrate 3 and then transferred to the first substrate 2 through the first particles 8 in the first region 4a. Accordingly, in the second substrate 3, heat in a place where a distance from the first region 4a is short reaches the first region 4a early, and therefore, the heat is transferred early. Then, in the second substrate 3, heat in a place where a distance from the first region 4a is long reaches the first region 4a late, and therefore, the heat is transferred late.

When the first region 4a is located in the center of the second substrate 3, as compared with the case where the first region 4a is located at an end of the second substrate 3, a distance between a place on the second substrate 3 far from the first region 4a and the first region 4a can be made short. Then, the heat in the second region 4b of the second substrate 3 can be prevented from being transferred late. Therefore, a variation in the temperature distribution in the second substrate 3 can be reduced.

Figure 5:
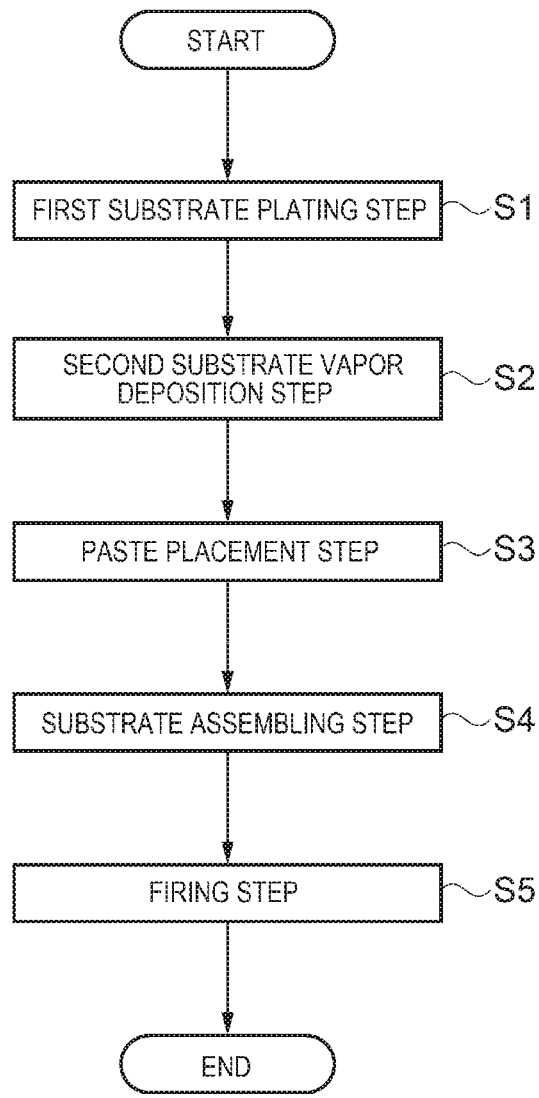
FIG. 5 is a flowchart of a method for producing a phosphor element.

Next, a method for producing the phosphor element 1 described above will be described with reference to FIGS. 5 to 12. FIG. 5 is a flowchart of a method for producing the phosphor element, and FIGS. 6 to 12 are schematic views for illustrating the method for producing the phosphor element. In the flowchart of FIG. 5, a step S1 is a first substrate plating step. This step is a step of mounting the first auxiliary film 6 on the first substrate 2. Then, the process proceeds to a step S2. The step S2 is a second substrate vapor deposition step. This step is a step of mounting the second auxiliary film 7 on the second substrate 3. Then, the process proceeds to a step S3.

The step S3 is a paste placement step. This step is a step of placing the first paste including the first particles 8 and the second paste including the second particles 9 on the first substrate 2. Then, the process proceeds to a step S4. The step S4 is a substrate assembling step. This step is a step of mounting the second substrate 3 on the first paste and the second paste. Then, the process proceeds to a step S5. The step S5 is a firing step. This step is a step of firing the first paste and the second paste by heating. The production process for the phosphor element is completed by the above-mentioned steps.

Figure 6:
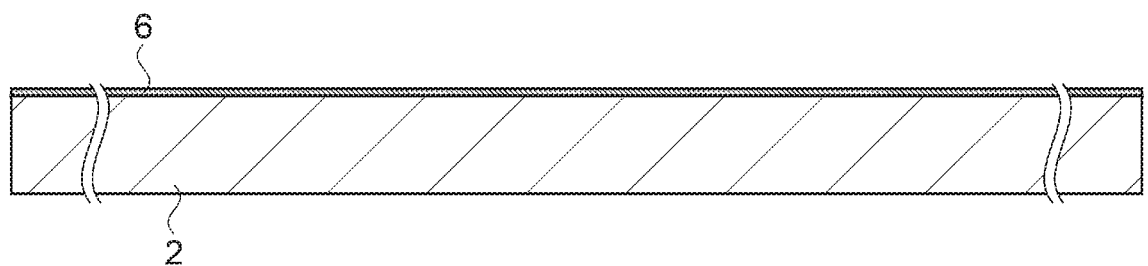
FIG. 6 is a schematic view for illustrating the method for producing a phosphor element.

Next, the production method will be described in detail in association with the steps shown in FIG. 5 with reference to FIGS. 6 to 12. FIG. 6 is a view corresponding to the first substrate plating step of the step S1. As shown in FIG. 6, in the step S1, the first auxiliary film 6 is mounted on the first substrate 2. First, the first substrate 2 is prepared. Subsequently, a resin film is mounted on the other face excluding the place where the first auxiliary film 6 is to be mounted. The resin film is mounted using any of various printing methods or coating methods. Then, chromium and gold are plated on the first substrate 2. The first substrate 2 is a copper plate, and therefore, electroplating can be performed. Subsequently, the resin film is removed using a stripping solution, whereby the first auxiliary film 6 is mounted in a predetermined place on the first substrate 2.

Figure 7:
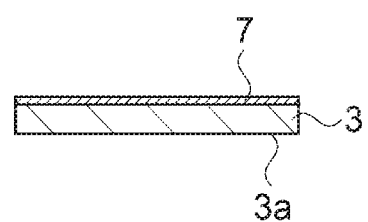
FIG. 7 is a schematic view for illustrating the method for producing a phosphor element.

FIG. 7 is a view corresponding to the second substrate vapor deposition step of the step S2. As shown in FIG. 7, the second substrate 3 is prepared. The second substrate 3 is produced by a known method, and therefore, a detailed description will be omitted and an outline of the production method will be described. As the material of the second substrate 3, an alumina powder and a phosphor powder are mixed with a binder to form a paste. Subsequently, the material of the second substrate 3 is fired, whereby the second substrate 3 is formed.

Subsequently, a resin film is applied to the upper face 3a and dried. By the resin film, the upper face 3a is covered and masked. Subsequently, the second substrate 3 is set on a vapor deposition device, a silver vapor deposition film is formed on the second substrate 3. Subsequently, the resin film is stripped off from the second substrate 3 using a stripping solution, whereby the second auxiliary film 7 is mounted.

Figure 8:
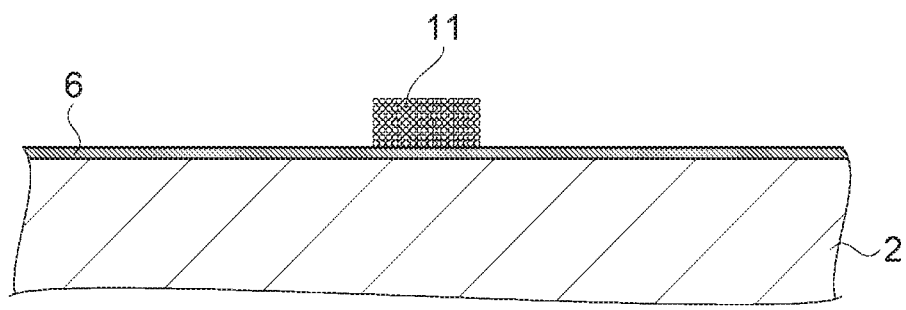
FIG. 8 is a schematic view for illustrating the method for producing a phosphor element.
Figure 9:
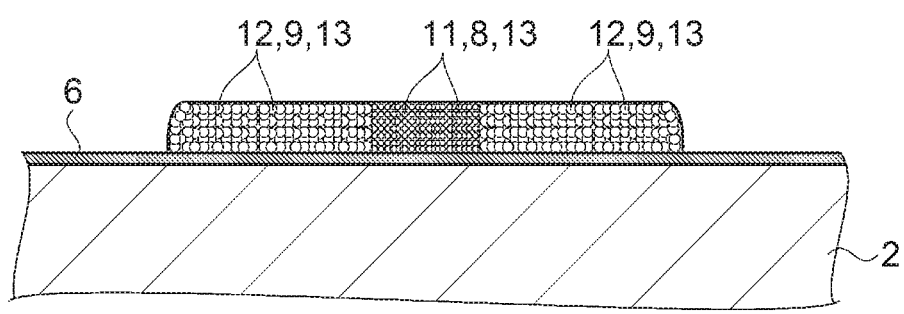
FIG. 9 is a schematic view for illustrating the method for producing a phosphor element.

FIGS. 8 and 9 are views corresponding to the paste placement step of the step S3. In the step S3, the first paste and the second paste are prepared. In the first paste, organometallic composite nanoparticles obtained by coating the first particles 8 with an organic shell are used. The organic shell prevents self-aggregation of the nanoparticles, and therefore, the form in which the nanoparticles are dispersed can be maintained. A worker adds the organometallic composite nanoparticles to a solvent such as an ether-based solvent, followed by stirring. Then, the first paste in which the metal nanoparticles are dispersed in the solvent is completed.

In the second paste, organometallic composite nanoparticles obtained by coating the second particles 9 with an organic shell are used. A worker adds the organometallic composite nanoparticles to a solvent such as an ether-based solvent, followed by stirring. Then, the second paste in which the metal nanoparticles are dispersed in the solvent is completed. In the first paste and the second paste, the metal nanoparticles, the solvent component and the organic shell component are included.

As shown in FIG. 8, a worker places a first paste 11 on the first auxiliary film 6 of the first substrate 2. In the first paste 11, the first particles 8 are included. Subsequently, as shown in FIG. 9, a worker places a second paste 12 on the first auxiliary film 6 of the first substrate 2. The second paste 12 is placed around the first paste 11. In the second paste 12, the second particles 9 are included. The first paste 11 and the second paste 12 are combined to form a paste 13. The paste 13 includes the first paste 11 and the second paste 12 which has a lower metal nanoparticle density than the first paste 11. Then, the paste 13 including the metal nanoparticles is placed on one face of the first substrate 2. When placing the paste 13, the second paste 12 is placed around the first paste 11 in a plan view of the first substrate 2. As a method for placing the first paste 11 and the second paste 12, any of various printing methods such as offset printing, screen printing, and relief printing can be used. At this time, it is necessary to accurately control the thickness of the paste 13 for accurately forming the joining film 4 so as to achieve a desired heat transfer property and a desired shape.

Figure 10:
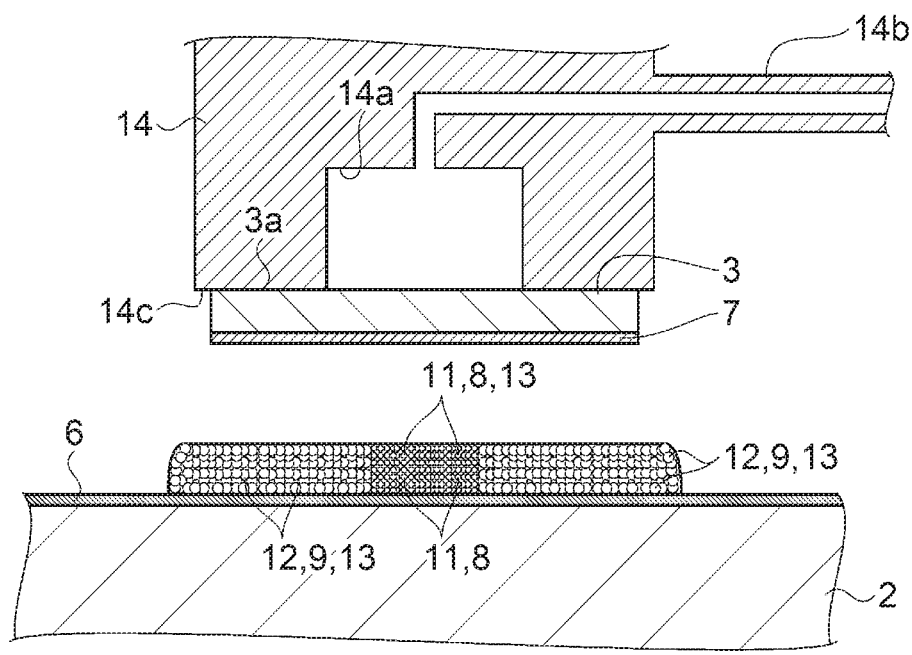
FIG. 10 is a schematic view for illustrating the method for producing a phosphor element.
Figure 11:
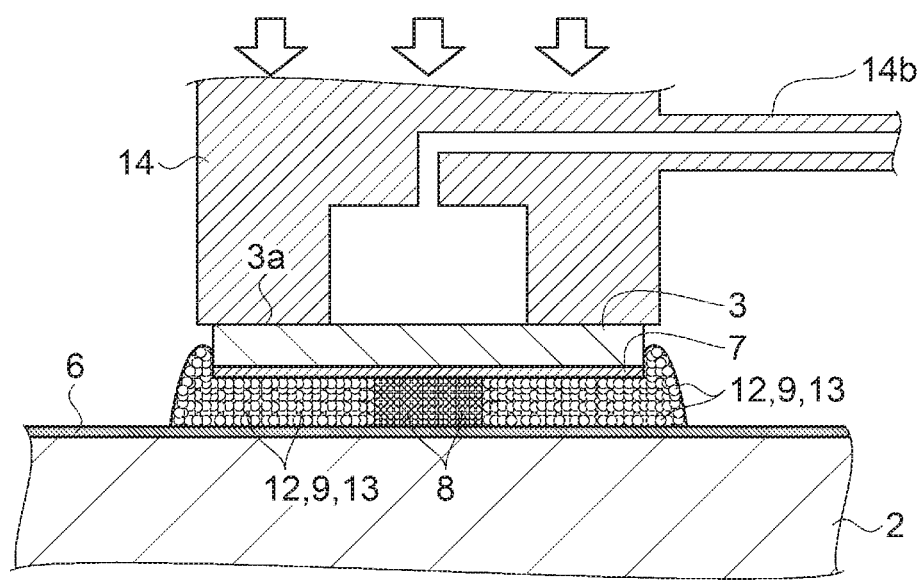
FIG. 11 is a schematic view for illustrating the method for producing a phosphor element.

FIGS. 10 and 11 are views corresponding to the substrate assembling step of the step S4. As shown in FIG. 10, in the step S4, a worker allows the second substrate 3 to stick to a specialized tool 14 by suction. In the specialized tool 14, a recessed portion 14a is provided. To the specialized tool 14, a pipe 14b which communicates with the recessed portion 14a is connected. To the pipe 14b, a vacuum pump (not shown) is connected. On the specialized tool 14, a flat suction face 14c is provided, and the recessed portion 14a is disposed on the suction face 14c. A worker operates the vacuum pump by bringing the suction face 14c into contact with the upper face 3a of the second substrate 3. The pressure in the recessed portion 14a is reduced, and therefore, the second substrate 3 is sucked and stuck to the specialized tool 14.

The specialized tool 14 is moved by an assembling device (not shown). A worker moves the second substrate 3 with high positional accuracy by controlling the assembling device. As the assembling device, a horizontal multi-joint robot or a cartesian coordinate robot can be used. Then, the assembling device makes the specialized tool 14 behave like a robot's hand. The second substrate 3 sucked and stuck to the specialized tool 14 is moved to a place facing the paste 13 by the assembling device.

As shown in FIG. 11, the assembling device moves the specialized tool 14 so as to bring the second substrate 3 into contact with the paste 13. By this operation, the paste 13 is sandwiched between the first substrate 2 and the second substrate 3. In the second paste 12, the density of the second particles 9 is low, and therefore, the second particles 9 easily move. Therefore, when an impact load is applied between the first substrate 2 and the second substrate 3, the stress can be relieved by moving the second particles 9 in the second paste 12. As a result, the second paste 12 can relieve stress applied to the second substrate 3 due to an impact load.

When the second substrate 3 presses the paste 13, the thickness of the paste 13 is decreased. Then, a portion of the paste 13 is swollen in the planar direction of the first substrate 2. Further, the paste 13 is also swollen on the side face side of the second substrate 3. As a result, the paste 13 projects from at least a part of the periphery of the second substrate 13 in a plan view of the first substrate 2.

The assembling device controls the second substrate 3 with high positional accuracy so that the distance between the first substrate 2 and the second substrate 3 becomes a predetermined distance. The assembling device prevents the paste 13 from being placed on the upper face 3a of the second substrate 3.

Figure 12:
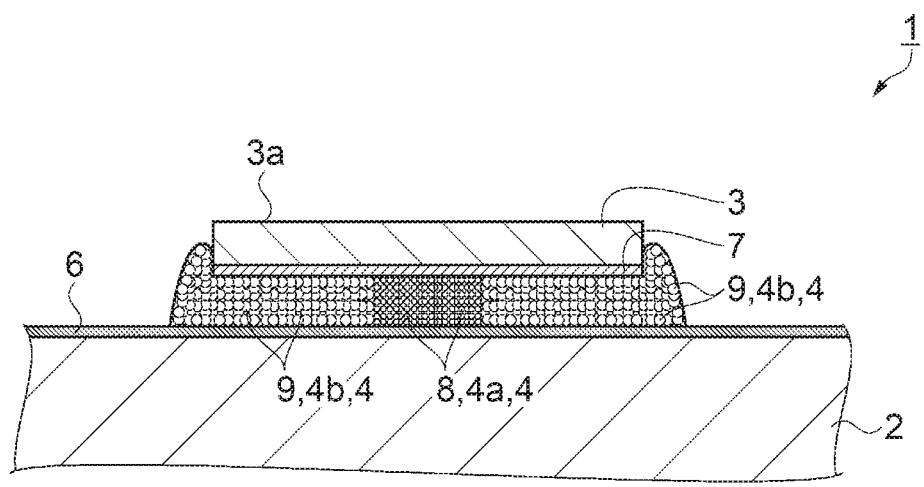
FIG. 12 is a schematic view for illustrating the method for producing a phosphor element.

FIG. 12 is a view corresponding to the firing step of the step S5. As shown in FIG. 12, in the step S5, a worker fires the paste 13 in a state where the second substrate 3 is mounted. The firing conditions are not particularly limited and are set according to the ratio of the organometallic composite nanoparticles to the solvent component in the paste 13 or the amount of the paste 13 to be placed. In this embodiment, the firing step is performed, for example, in two steps: a low-temperature firing step and a high-temperature firing step. In the low-temperature firing step, the paste 13 is fired at 80° C. to 100° C. In the low-temperature firing step, the solvent component is removed by evaporation.

In the high-temperature firing step, firing is performed at 200° C. to 250° C. By heating the paste 13 to 200° C. or higher, the remaining solvent component and the organic shell component are decomposed. The solvent component and the organic shell component are partially volatilized and released from the paste 13, and the residue is carbonized at a high temperature and remains in the joining film 4. The proportion of the remaining components resulted from carbonization of the solvent and the organic shell is small, and therefore the effect of the remaining components on the heat transfer property or the bonding ability of the joining film 4 is small.

In the high-temperature firing step, the organic shell is decomposed and removed, and therefore, the metal nanoparticles are easily bonded to one another, so that the paste 13 can be fired at a lower temperature than the melting point of the metal. In the high-temperature firing step, the paste 13 is fired to form the joining film 4, thereby joining the first substrate 2 to the second substrate 3. As a result, the phosphor element 1 is completed. By the above-mentioned steps, the production process for the phosphor element 1 is completed.

As described above, according to this embodiment, the following effects are obtained.

(1) According to this embodiment, the phosphor element 1 includes the first substrate 2 and the second substrate 3. The first substrate 2 and the second substrate 3 are joined to each other with the joining film 4. The joining film 4 has the first region 4a and the second region 4b. The first region 4a and the second region 4b have different metal nanoparticle diameter distributions. The particle diameter of the metal nanoparticles in the first region 4a is smaller than the particle diameter of the metal nanoparticles in the second region 4b. The first region 4a has a higher metal nanoparticle density than the second region 4b. Heat conduction occurs by transferring heat between the metal nanoparticles, and therefore, a region having a high metal nanoparticle density has a better heat transfer property than a region having a low metal nanoparticle density. The first region 4a has a high metal nanoparticle density, and therefore is a region having a good heat transfer property.

Since the second region 4b has a low metal nanoparticle density, the metal nanoparticles easily move in the second region 4b in the substrate assembling step of the step S4. Therefore, when an impact load is applied between the first substrate 2 and the second substrate 3, the stress can be relieved by moving the metal nanoparticles in the second region 4b. As a result, the phosphor element 1 can enhance the heat transfer property and also can relieve the stress due to the impact load.

(2) According to this embodiment, the first region 4a is disposed in the center of the second substrate 3, and the second region 4b is disposed around the first region 4a. The first region 4a has a high density of the first particles 8, and therefore is a region having a good heat transfer property. The heat of the second substrate 3 is transferred to the first substrate 2 through the first region 4a. The heat of the second substrate 3 in the second region 4b is partially transferred in the second particles 9 in the second region 4b. Further, the heat of the second substrate 3 in the second region 4b is partially transferred in the second substrate 3 and then transferred to the first substrate 2 through the first particles 8 in the first region 4a. Accordingly, in the second substrate 3, heat in a place where a distance from the first region 4a is short reaches the first region 4a early, and therefore, the heat is transferred early. Then, in the second substrate 3, heat in a place where a distance from the first region 4a is long reaches the first region 4a late, and therefore, the heat is transferred late.

When the first region 4a is located in the center of the second substrate 3, as compared with the case where the first region 4a is located at an end of the second substrate 3, a distance between a place on the second substrate 3 far from the first region 4a and the first region 4a can be made short. Then, the heat in the second region 4b of the second substrate 3 can be prevented from being transferred late. Therefore, a variation in the temperature distribution in the second substrate 3 can be reduced.

(3) According to this embodiment, the joining film 4 projects from the periphery of the second substrate 3 in a plan view of the first substrate 2. The heat of the second substrate 3 is transferred to the first substrate 2 through the joining film 4. Therefore, the joining film 4 projecting from the periphery of the second substrate 3 also transfers heat. Accordingly, as compared with the case where the joining film 4 does not project from the periphery of the second substrate 3, heat can be efficiently transferred.

The joining film 4 is not mounted on the upper face 3a of the second substrate 3. The upper face 3a is a face on the opposite side to the first substrate 2 side in the second substrate 3. The joining film 4 includes metal nanoparticles, and therefore has electrical conductivity. In the phosphor element 1, the joining film 4 is not mounted on the upper face 3a of the second substrate 3, and therefore, the occurrence of an electrical defect due to the joining film 4 can be suppressed. Further, when the joining film 4 is mounted on the upper face 3a, an unevenness of the joining film 4 is formed on the upper face 3a. In the phosphor element 1, the joining film 4 is not mounted on the upper face 3a of the second substrate 3, and therefore, the occurrence of a defect due to the unevenness of the joining film 4 can be suppressed.

(4) According to this embodiment, the paste 13 which includes metal nanoparticles is placed on one face of the first substrate 2. Then, the paste 13 is sandwiched between the first substrate 2 and the second substrate 3. Then, the paste 13 is fired. The metal nanoparticles have a small particle diameter and are fine, and therefore have a high bonding property, and the particles are joined to one another at a lower temperature than the melting point of the metal constituting the metal nanoparticles. Accordingly, the first substrate 2 and the second substrate can be bonded to each other by firing the paste 13 containing the metal nanoparticles.

The paste 13 includes the first paste 11 and the second paste 12. The first paste 11 has a high metal nanoparticle density, and the second paste 12 has a low metal nanoparticle density. That is, the first paste 11 has a higher metal nanoparticle density than the second paste 12. Heat transfer occurs between the metal nanoparticles, and therefore, the first region 4a where the first paste 11 having a high metal nanoparticle density is fired has a better heat transfer property than the second region 4b where the second paste 12 having a low metal nanoparticle density is fired. At this time, the first region 4a has a high metal nanoparticle density, and therefore, the first region 4a becomes a place having a better heat transfer property than the second region 4b.

In a plan view of the second substrate 3, the second paste 12 is placed around the first paste 11. Therefore, the second region 4b is placed around the first region 4a. The heat of the second substrate 3 is easily transferred to the first substrate 2 through the first region 4a. Therefore, in the second substrate 3, heat in a place near the first region 4a is easily transferred to the first substrate 2, and heat in a place far from the first region 4a is less easily transferred to the first substrate 2. When the first region 4a is located on the inside of the second region 4b, as compared with the case where the first region 4a is located in a place at an end of the second region 4b, the distance between a place in the second substrate 3 far from the first region 4a and the first region 4a can be made short. Therefore, a variation in the temperature distribution in the second substrate 3 can be reduced.

Since the second paste 12 has a low density of the second particles 9, the second particles 9 easily move in the second paste 12 in the substrate assembling step of the step S4. Therefore, when an impact load is applied between the first substrate 2 and the second substrate 3, the stress can be relieved by moving the second particles 9 in the second paste 12. As a result, the phosphor element 1 can enhance the heat transfer property and also can relieve the stress due to the impact load.

Second Embodiment

Next, an embodiment of a phosphor element will be described with reference to a principal part schematic plan view of a phosphor element of FIG. 13. This embodiment is different from the first embodiment in that the joining film 4 projects from a part of the periphery of the second substrate 3. A description of the same matter as in the first embodiment will be omitted.

Figure 13:
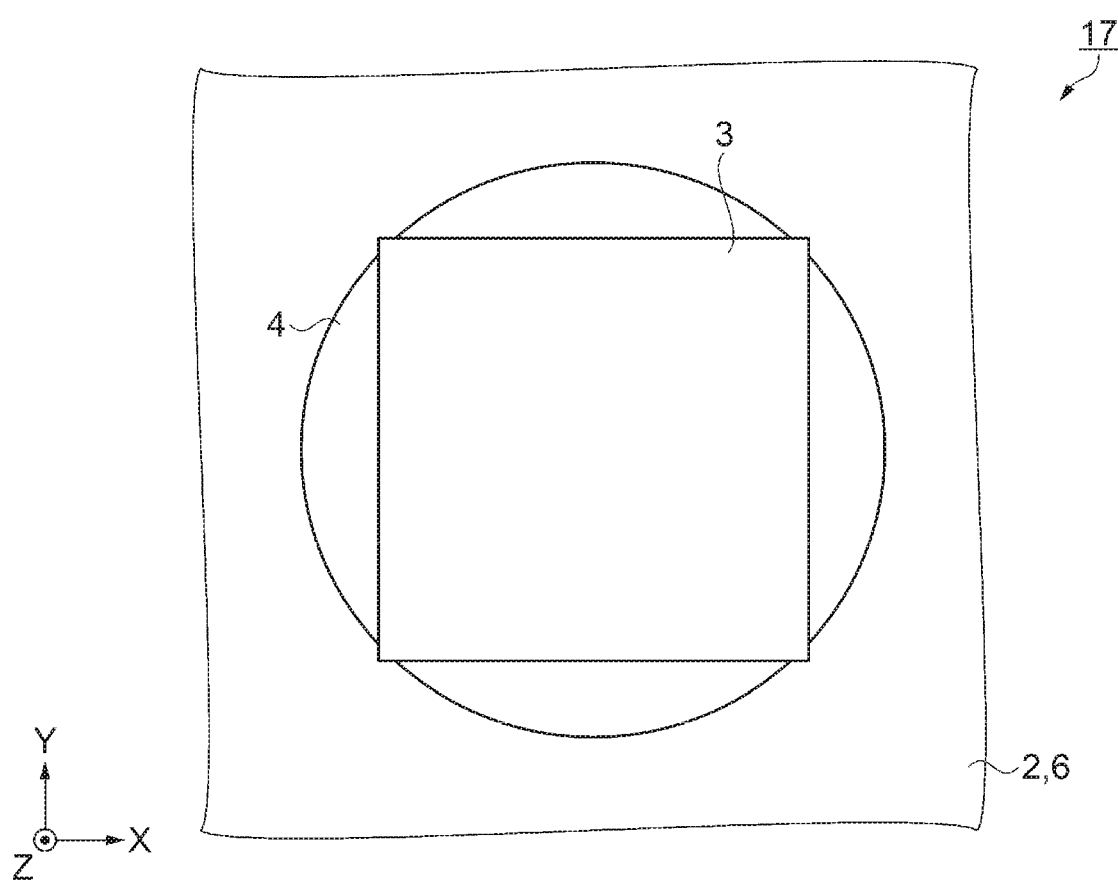
FIG. 13 is a principal part schematic plan view of a phosphor element according to a second embodiment.

That is, in this embodiment, as shown in FIG. 13, in a phosphor element 17 as the joined body, the joining film 4 projects from a part of the periphery of the second substrate 3 in a plan view of the first substrate 2. That is, the joining film 4 does not project from the four corners of the second substrate 3, but projects from the middle of the four sides. At this time, heat is transferred through the joining film 4 in a place facing the second substrate 3, and the joining film 4 projecting from the periphery of the second substrate 3 also transfers heat. Therefore, as compared with the case where the joining film 4 does not project from the periphery of the second substrate 3, heat can be efficiently transferred.

Third Embodiment

Figure 15:
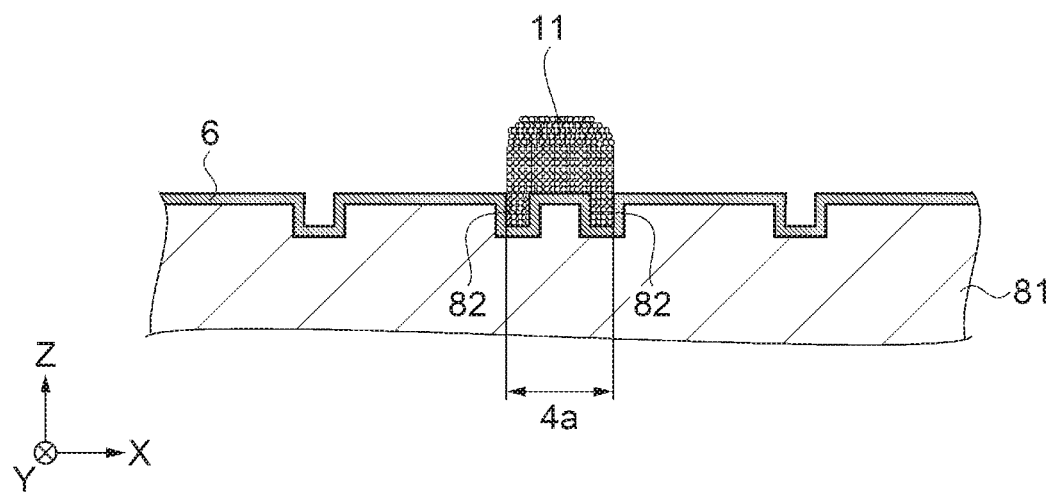
FIG. 15 is a schematic side cross-sectional view of a phosphor element.
Figure 16:
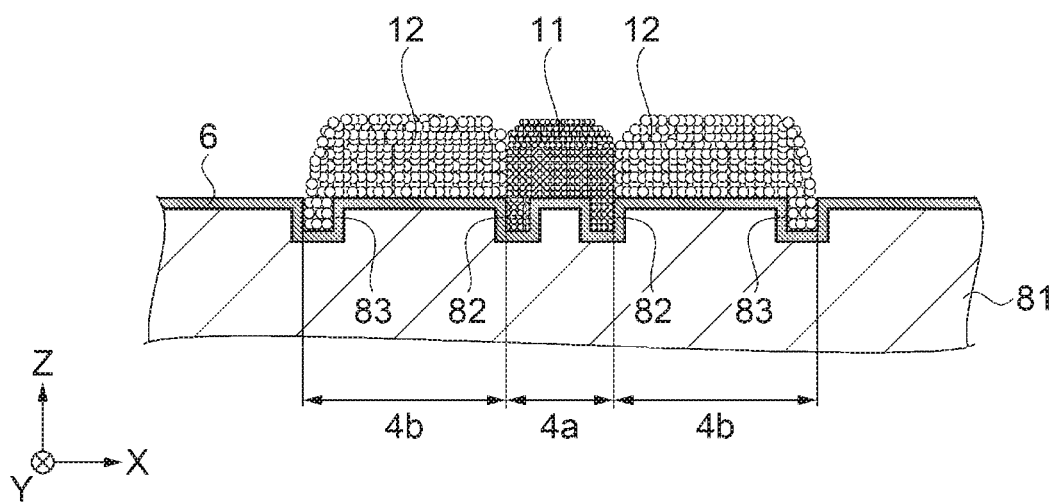
FIG. 16 is a schematic side cross-sectional view of a phosphor element.

Next, an embodiment of a phosphor element will be described with reference to the schematic side cross-sectional views showing a phosphor element of FIGS. 14 to 16. This embodiment is different from the first embodiment in that a groove is provided in the first substrate 2. A description of the same matter as in the first embodiment will be omitted.

Figure 14:
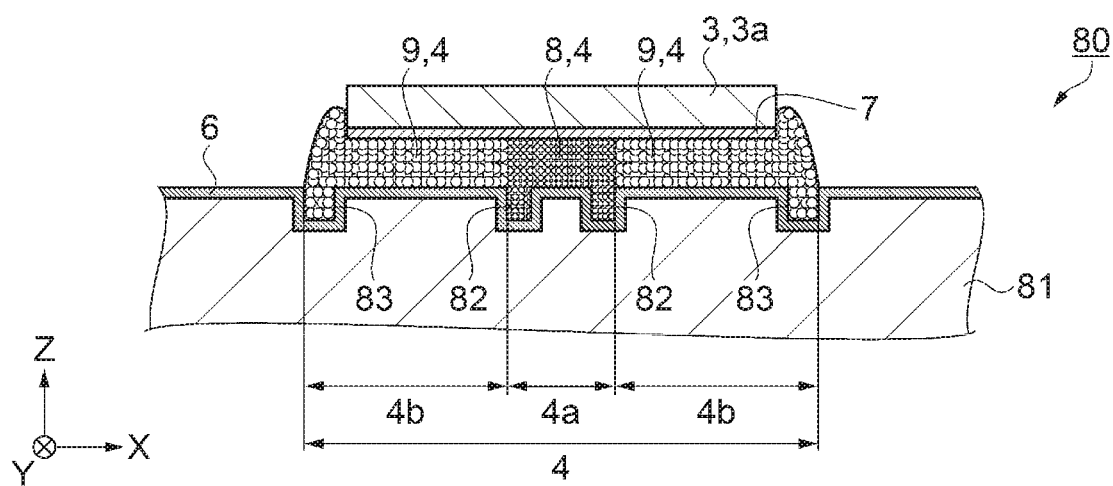
FIG. 14 is a schematic side cross-sectional view of a phosphor element according to a third embodiment.

That is, in this embodiment, as shown in FIG. 14, a phosphor element 80 as the joined body includes a first substrate 81. In the first substrate 81, a first groove 82 is provided along the outer periphery of the first region 4a. Then, a second groove 83 is provided along the outer periphery of the second region 4b.

The first paste 11 which is the material of the joining film 4 is in a liquid form. As shown in FIG. 15, when the first paste 11 to be placed in the first region 4a is applied to the first substrate 81, the first paste 11 spreads on the first substrate 81. At this time, since the first groove 82 is provided along the outer periphery of the first region 4a, when the first paste 11 reaches the first groove 82, the first paste 11 enters the first groove 82. At this time, the application range is stabilized by the surface tension of the first paste 11 by the presence of the first groove 82. Therefore, the spread of the first paste 11 across the first groove 82 can be reduced.

Similarly, the second paste 12 which is the material of the joining film 4 is in a liquid form. As shown in FIG. 16, when the second paste 12 to be placed in the second region 4b is applied to the first substrate 81, the second paste 12 spreads on the first substrate 81. At this time, since the second groove 83 is provided along the outer periphery of the second region 4b, when the second paste 12 reaches the second groove 83, the second paste 12 enters the second groove 83. At this time, the application range is stabilized by the surface tension of the second paste 12 by the presence of the second groove 83. Therefore, the spread of the second paste 12 across the second groove 83 can be reduced. Accordingly, the first paste 11 and the second paste 12 can be disposed at proper positions. As a result, the joining film 4 can be disposed in the first region 4a and the second region 4b in high quality.

Fourth Embodiment

Figure 17:
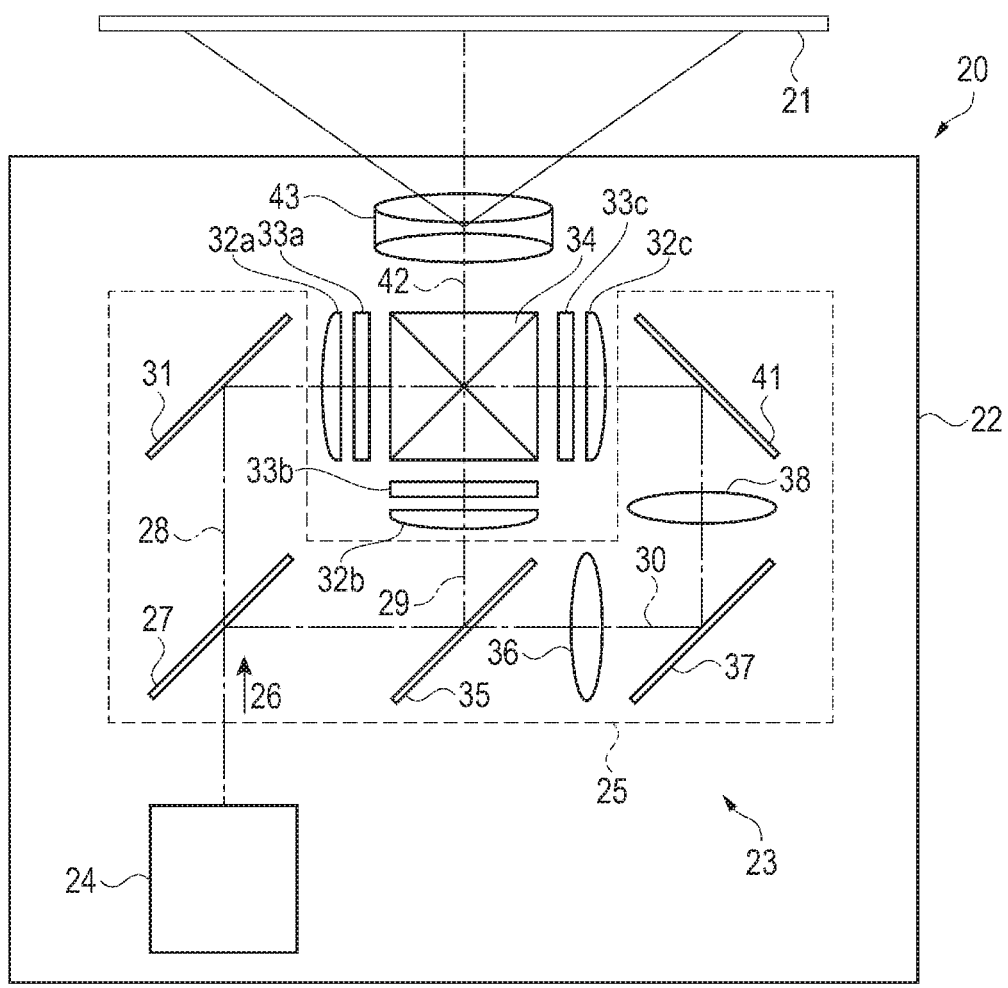
FIG. 17 is a schematic view showing a structure of a projector according to a fourth embodiment.
Figure 18:
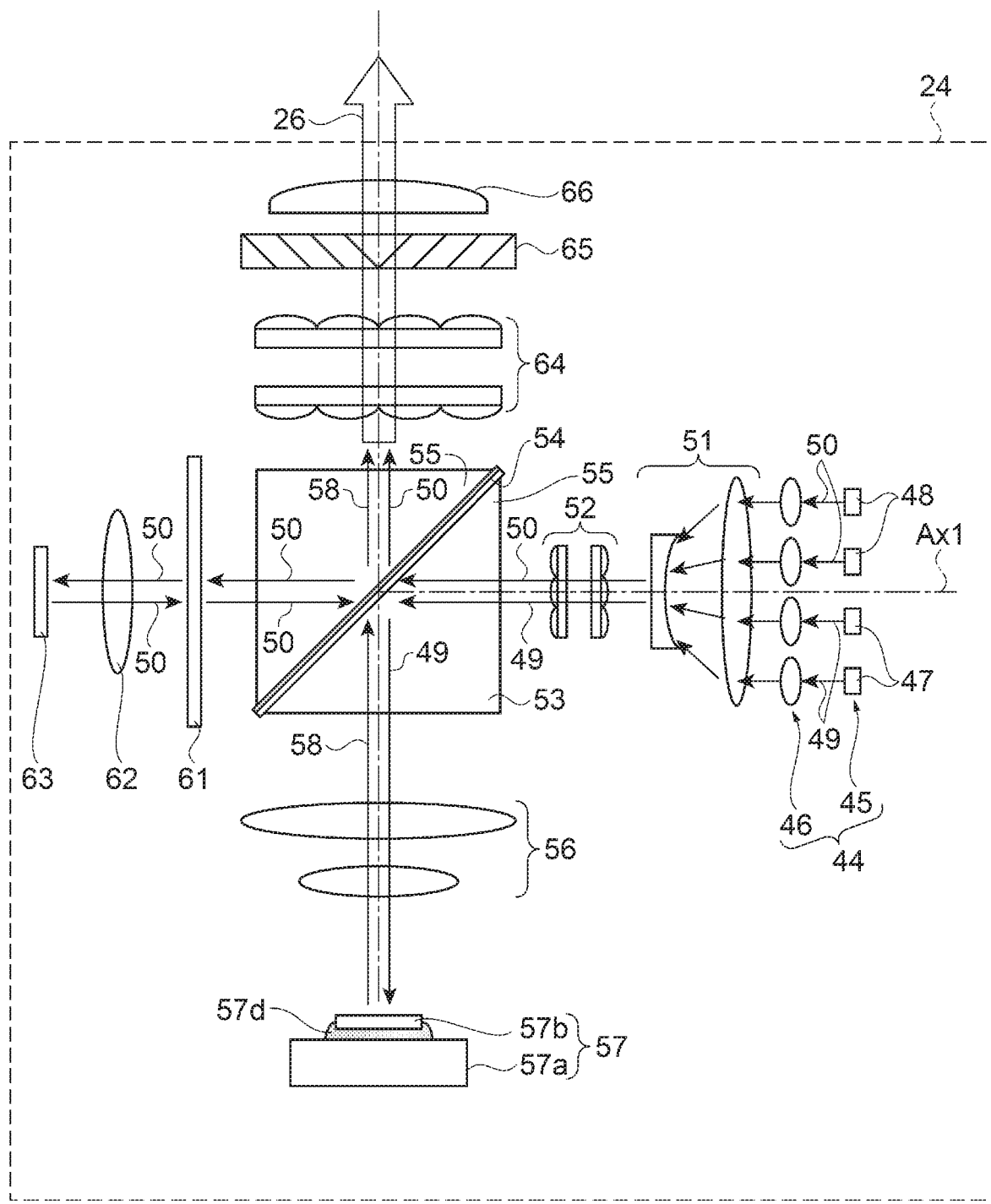
FIG. 18 is a schematic view showing a structure of a light source device.

Next, a projector using the phosphor element will be described with reference to FIGS. 17 and 18. FIG. 17 is a schematic view showing a structure of a projector, and FIG. 18 is a schematic view showing a structure of a light source device. As shown in FIG. 17, a projector 20 is a display device which modulates a luminous flux emitted from a light source device 24 provided in the projector 20 and forms an image according to image information, and enlarges and projects the image on a projection face of a screen 21. The projector 20 includes an exterior housing 22. In the exterior housing 22, not only an optical unit 23, but also a control device (not shown), a cooling device (not shown), a power supply device (not shown), etc. are housed.

The optical unit 23 includes the light source device 24. The light source device 24 emits illumination light 26 to a color separation device 25. The color separation device 25 is a device which separates the illumination light 26 incident from the light source device 24 into three color lights of red (R), green (G), and blue (B). The illumination light 26 is incident on a dichroic mirror 27 of the color separation device 25. The dichroic mirror 27 transmits red light 28 and reflects green light 29 and blue light 30.

The red light 28 transmitted through the dichroic mirror 27 is reflected by a total reflection mirror 31 and emitted from the color separation device 25. Subsequently, the red light 28 passes through a collimating lens 32a and a light modulator 33a and is emitted toward a color combining device 34. The green light 29 reflected by the dichroic mirror 27 is reflected by a dichroic mirror 35 and emitted from the color separation device 25. Subsequently, the green light 29 passes through a collimating lens 32b and a light modulator 33b and is emitted toward the color combining device 34. The blue light 30 reflected by the dichroic mirror 27 passes through the dichroic mirror 35 and a relay lens 36 and proceeds to a total reflection mirror 37. The blue light 30 is reflected by the total reflection mirror 37 and passes through a relay lens 38 and then proceeds to a total reflection mirror 41. The blue light 30 is reflected by the total reflection mirror 41 and emitted from the color separation device 25. Subsequently, the blue light 30 passes through a collimating lens 32c and a light modulator 33c and is emitted toward the color combining device 34.

The optical path length of the blue light 30 is longer than the optical path lengths of the red light 28 and the green light 29. The relay lens 36 and the relay lens 38 compensate for the light loss of the blue light 30. The collimating lens 32a converts light incident on the light modulator 33a into parallel light, and the collimating lens 32b converts light incident on the light modulator 33b into parallel light. The collimating lens 32c converts light incident on the light modulator 33c into parallel light. Each of the light modulator 33a, the light modulator 33b, and the light modulator 33c modulates light incident thereon to form a color image corresponding to the image information. In each of the light modulator 33a, the light modulator 33b, and the light modulator 33c, a liquid crystal panel is used.

On the color combining device 34, the red light 28, the green light 29, and the blue light 30 are incident. The color combining device 34 combines the red light 28, the green light 29, and the blue light 30 to form combined light 42, and the combined light 42 is emitted toward a projection optical device 43. In this embodiment, the color combining device 34 is composed of a cross dichroic prism. The projection optical device 43 projects the combined light combined by the color combining device 34 on the projection face of the screen 21. By the projector 20 having such a configuration, an enlarged image is projected on the screen 21.

Next, the structure of the light source device 24 will be described. As shown in FIG. 18, the light source device 24 includes a light source 44. The light source 44 includes an array light source 45 and a collimator optical system 46. In the array light source 45, a plurality of first semiconductor lasers 47 and a plurality of second semiconductor lasers 48 are arranged side by side in an array.

The first semiconductor laser 47 emits excitation light 49 as light. The excitation light 49 is, for example, laser light having a peak wavelength of 440 nm. The second semiconductor laser 48 emits blue light 50. The blue light 50 is, for example, laser light having a peak wavelength of 460 nm. The excitation light 49 and the blue light 50 emitted from the array light source 45 pass through the collimator optical system 46 and are emitted from the light source 44.

Subsequently, the excitation light 49 and the blue light 50 pass through an afocal optical system 51 and a homogenizer optical system 52 and proceed to a polarization separation device 53. The afocal optical system 51 adjusts the luminous flux diameters of the excitation light 49 and the blue light 50. The homogenizer optical system 52 enhances the uniformity of illuminance distribution in an illuminated region.

The excitation light 49 incident on the polarization separation device 53 proceeds to the lower side of FIG. 18. The blue light 50 incident on the polarization separation device 53 proceeds to the left side of FIG. 18. Then, the polarization separation device 53 separates the excitation light 49 and the blue light 50. The polarization separation device 53 is a prism-type polarization beam splitter. The polarization separation device 53 is configured to sandwich a polarization separation layer 54 between two prisms 55.

The polarization separation layer 54 separates light incident thereon into an S-polarized light component and a P-polarized light component contained in the light. Specifically, the polarization separation layer 54 reflects the S-polarized light component and transmits the P-polarized light component. Further, the polarization separation layer 54 has a color separation property in which light having a predetermined wavelength or longer is transmitted whether the polarized light component is an S-polarized light component or a P-polarized light component. The excitation light 49 and the blue light 50 are both linearly polarized light. The excitation light 49 is S-polarized light and is reflected by the polarization separation layer 54. The blue light 50 is P-polarized light and is transmitted through the polarization separation layer 54.

The light source device 24 includes a wavelength conversion section 57 which converts the wavelength of the excitation light 49 emitted from the light source 44. The excitation light 49 emitted from the polarization separation device 53 passes through a pick-up optical system 56 and is irradiated on the wavelength conversion section 57. The pick-up optical system 56 condenses the excitation light 49 on the wavelength conversion section 57. The wavelength conversion section 57 is excited by the excitation light 49 irradiated thereon and emits yellow light 58 which is fluorescent light having a longer wavelength than the excitation light 49. The wavelength conversion section 57 is a joined body in which a first substrate 57a that dissipates heat and a second substrate 57b that has a phosphor are joined to each other with a joining film 57d, and as the wavelength conversion section 57, the phosphor element 1, the phosphor element 17, or the phosphor element 80 is used.

The temperature of the second substrate 57b is increased by the excitation light 49 irradiated thereon. Then, the temperature of the second substrate 57b is maintained at a moderate temperature by transferring heat from the second substrate 57b to the first substrate 57a. As the wavelength conversion section 57, the phosphor element 1, the phosphor element 17, or the phosphor element 80 is used. The phosphor element 1, the phosphor element 17, or the phosphor element 80 has a good heat transfer property and also can relieve stress due to an impact load in the production process. Therefore, the wavelength conversion section 57 can reliably suppress an excessive increase in the temperature. The wavelength conversion section 57 can relieve stress due to an impact load, and therefore, even if an impact is applied thereto in the production process, it is hardly broken, and thus, the wavelength conversion section 57 can be easily produced. As a result, the projector 20 can be configured as a device including the wavelength conversion section 57 which can reliably suppress an excessive increase in the temperature and is easily produced.

The yellow light 58 emitted from the wavelength conversion section 57 passes through the pick-up optical system 56 and then is incident on the polarization separation device 53. The pick-up optical system 56 condenses the yellow light 58 emitted from the wavelength conversion section 57. Then, the yellow light 58 passes through the polarization separation layer 54 of the polarization separation device 53.

On the other hand, the blue light 50 transmitted through the polarization separation layer 54 passes through a retardation plate 61 and a pick-up lens 62, and is irradiated on a diffuse reflection element 63. The blue light 50 is reflected by the diffuse reflection element 63, and thereafter passes through the pick-up lens 62 and the retardation plate 61, and then is emitted toward the polarization separation device 53. The retardation plate 61 is a ¼-wave plate and is disposed in the optical path between the polarization separation device 53 and the diffuse reflection element 63. This retardation plate 61 converts the blue light 50 which is P-polarized light incident from the polarization separation device 53 into circularly polarized light. The pick-up lens 62 condenses the blue light 50 toward the diffuse reflection element 63.

The diffuse reflection element 63 diffuses and reflects the blue light 50 incident thereon. Subsequently, the blue light 50 is converted into S-polarized light by the retardation plate 61. Then, the blue light 50 is incident on the polarization separation device 53. The blue light 50 is reflected by the polarization separation layer 54 of the polarization separation device 53 and is incident on an integrator optical system 64. At this time, the blue light 50 is incident on the integrator optical system 64 together with the yellow light 58 transmitted through the polarization separation device 53.

The blue light 50 and the yellow light 58 pass through the integrator optical system 64, a polarization conversion element 65, and a superimposing lens 66, and is emitted from the light source device 24. The blue light 50 and the yellow light 58 emitted from the light source device 24 are used as illumination light 26.

The integrator optical system 64 makes the illuminance distribution in an illuminated region uniform in cooperation with the superimposing lens 66. This integrator optical system 64 includes a pair of lens arrays. In the lens array, a plurality of lenses are arranged in an array. The blue light 50 and the yellow light 58 emitted from the integrator optical system 64 are incident on the polarization conversion element 65.

The polarization conversion element 65 includes a retardation plate and a light transmitting member in which a polarization separation layer and a reflection layer are formed. Then, the polarization conversion element 65 converts the blue light 50 and the yellow light 58 incident thereon into linearly polarized light whose polarization direction is aligned. The superimposing lens 66 superimposes the blue light 50 and the yellow light 58 incident from the polarization conversion element 65 on the illuminated region. The blue light 50 and the yellow light 58 emitted from the superimposing lens 66 are incident on the color separation device 25 as the illumination light 26.

As described above, according to this embodiment, the following effects are obtained.

(1) According to this embodiment, the projector includes the light source 44 and the wavelength conversion section 57. The wavelength conversion section converts the wavelength of the excitation light 49 emitted from the light source 44. The wavelength conversion section 57 is a joined body in which the first substrate 57a that dissipates heat and the second substrate 57b that has a phosphor are joined to each other with the joining film 57d. When the excitation light 49 is irradiated on the second substrate 57b, the second substrate 57b emits light. At this time, by emitting the yellow light 58 having a different wavelength from that of the irradiated excitation light 49, the wavelength is converted.

The temperature of the second substrate 57b is increased by the excitation light 49 irradiated thereon. Then, the temperature of the second substrate 57b is maintained at a moderate temperature by transferring heat from the second substrate 57b to the first substrate 57a. As the wavelength conversion section 57, the phosphor element 1 or the phosphor element 17 is used. The phosphor element 1 or the phosphor element 17 has a good heat transfer property and also can relieve stress due to an impact load in the production process. Therefore, the wavelength conversion section 57 can reliably suppress an excessive increase in the temperature. The wavelength conversion section 57 can relieve stress due to an impact load, and therefore, even if an impact is applied thereto in the production process, it is hardly broken, and thus, the wavelength conversion section 57 can be easily produced. As a result, the projector 20 can be configured as a device including the wavelength conversion section 57 which can reliably suppress an excessive increase in the temperature of the second substrate 57b and is easily produced.

Comparative Example

In JP-A-2014-29897 (Patent Document 2), one type of metal particle diameter is set, and a plurality of regions having different particle densities are provided by changing the amount of the solvent for the paste. Then, a region which easily transfers heat and has low impact resistance and a region which less easily transfers heat and has high impact resistance are provided. In the process for producing the plurality of regions, it is necessary to carefully control the temperature profile. Specifically, control is performed such that a temperature increasing rate is set low in a temperature region in which the organic solvent remains much in the solvent for the paste, and a temperature increasing rate is set high in a temperature region in which the amount of the organic solvent is decreased. Since the regions in which the amount of the solvent for the paste is different are set, it is necessary to set a complicated temperature profile.

Further, control is performed such that a load is set low in the temperature region in which the organic solvent remains much, and a load is set high in the temperature region in which the amount of the organic solvent is decreased. In this manner, in order to form a density gradient with one type of metal particle diameter, a device capable of accurately control the temperature profile and the load is needed. Therefore, in order to perform mass production of the phosphor element, many special devices are needed, and thus, it is difficult to produce the phosphor element with high productivity.

Further, when the amount of the solvent for the paste is increased, voids become large, and therefore, the impact resistance may be deteriorated. Unlike Patent Document 2, in the phosphor element 1, a plurality of types of metal particle diameters are used, and therefore, it is easy to control the sintering conditions. Further, voids can be prevented from becoming excessively large.

This embodiment is not limited to the above-mentioned embodiments and various changes and modifications can be added by those ordinarily skilled in the art within the scope of the technical idea of the invention.

Hereinafter, modification examples will be described.

First Modification Example

In the first embodiment, in the paste placement step of the step S3, the paste 13 is placed on the first substrate 2. The paste 13 may be placed on the second substrate 3 without placing the paste 13 on the first substrate 2. When placing the paste 13, the second paste 12 is placed around the first paste 11 in a plan view of the second substrate 3. In the case where production is more easily performed by this method when using a production device, the paste 13 may be placed on the second substrate 3. Also at this time, a variation in the temperature distribution in the second substrate 3 can be reduced. Then, the stress occurring in the second substrate 3 due to an impact load can be relieved.

Second Modification Example

Figure 19:
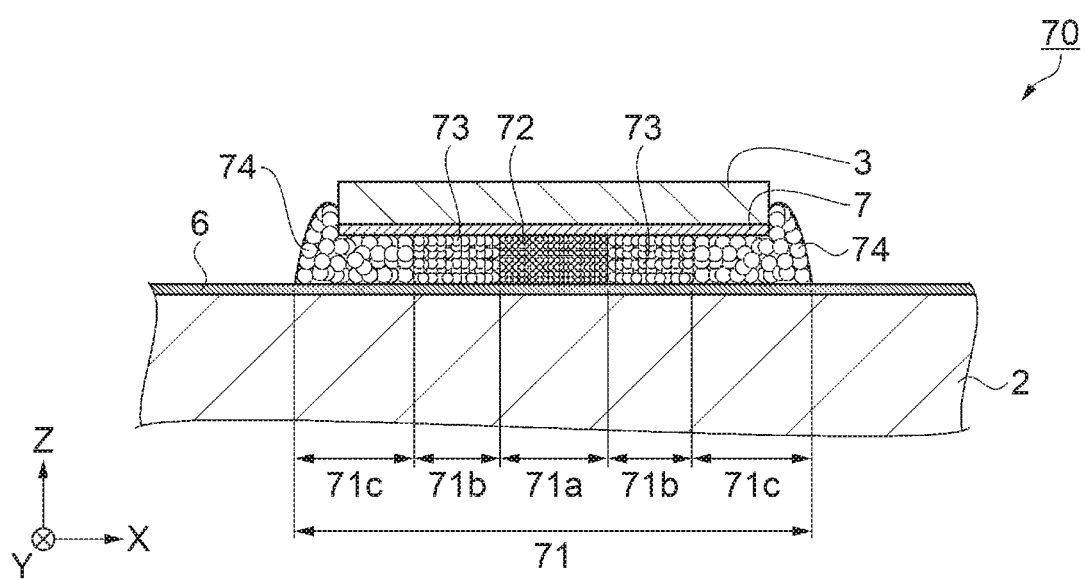
FIG. 19 is a schematic side cross-sectional view showing a structure of a joining film according to a modification example.

In the first embodiment, the joining film 4 is composed of two regions: the first region 4a and the second region 4b. The joining film 4 may be composed of three or more regions. FIG. 19 is a schematic side cross-sectional view showing a structure of a joining film. As shown in FIG. 19, a phosphor element 70 as a joined body includes a joining film 71 which joins the first substrate 2 to the second substrate 3. The joining film 71 has a first region 71a, a second region 71b, and a third region 71c.

In the first region 71a, many first particles 72 are placed, and in the second region 71b, many second particles 73 are placed. In the third region 71c, many third particles 74 are placed. The joining film 71 includes three types of metal nanoparticles having different particle diameters. The average particle diameters of the respective particles are not particularly limited, however, for example, in this modification example, the average particle diameter of the first particles 72 is from 10 nm to 50 nm, and the average particle diameter of the second particles 73 is from 40 nm to 80 nm. The average particle diameter of the third particles 74 is from 60 nm to 100 nm. The first particle 72, the second particle 73, and the third particle 74 are metal nanoparticles having different particle diameters. In this manner, the joining film 71 includes a plurality of types of metal nanoparticles having different particle diameters. Specifically, the joining film 71 includes three types of metal nanoparticles having different particle diameter distributions. As the particle diameter is smaller, a gap between the particles is smaller. Therefore, in a plan view of the first substrate 2, the first region 71a has a higher metal nanoparticle density than the second region 71b. In a plan view of the first substrate 2, the second region 71b has a higher metal nanoparticle density than the third region 71c.

The first region 71a is disposed in the center of the second substrate 3, and the second region 71b is disposed around the first region 71a. The third region 71c is disposed around the second region 71b. Therefore, the heat transfer of the joining film 71 is higher as coming closer to the center of the second substrate 3. Then, the metal nanoparticles in the joining film 71 move more easily as coming closer to the outer periphery of the second substrate 3. Accordingly, the phosphor element 70 can enhance the heat transfer property and also can relieve stress due to an impact load. The number of types of metal nanoparticles having different particle diameters to be included in the joining film may be 4 or more. The heat transfer property and the impact resistance can be set more finely.

Third Modification Example

In the first embodiment, the first region 4a is disposed in the center of the second substrate 3, and the second region 4b is disposed around the first region 4a. When the temperature in a place near the outer periphery of the second substrate 3 becomes high, the second region 4b may be disposed in the center of the second substrate 3, and the first region 4a may be disposed around the second region 4b. The heat of the second substrate 3 can be efficiently transferred to the first substrate 2.

The entire disclosure of Japanese Patent Application No. 2018-019860, filed Feb. 7, 2018 is expressly incorporated by reference herein.

What is claimed is:
1. A joined body, comprising:
a first substrate;
a second substrate which faces the first substrate; and
a joining film which joins the first substrate to the second substrate, wherein
the joining film includes a plurality of types of metal nanoparticles, the joining film has a first region and a second region, and in a plan view of the first substrate, the first region has a higher metal nanoparticle density than the second region, an average particle diameter of the metal nanoparticles in the first region is in a 10 nm and 60 nm, and an average particle diameter of the metal nanoparticles in the second region is in a range of 60 nm and 100 nm, and wherein the first region is disposed in a center of the second substrate in a plan view, and the second region is disposed around the first region.

2. The joined body according to claim 1, wherein the joining film projects from at least a part of a periphery of the second substrate in the plan view, and in the second substrate, the joining film is not mounted on an upper face which is a face on an opposite side to the first substrate.

3. The joined body according to claim 1, wherein in the first substrate, a first groove is provided along an outer periphery of the first region, and a second groove is provided along an outer periphery of the second region.

4. A method for producing a joined body, comprising:

placing a paste including a plurality of types of metal nanoparticles on one face of a first substrate or a second substrate;

sandwiching the paste between the first substrate and the second substrate; and firing the paste, wherein the paste includes a first paste and a second paste having a lower metal nanoparticle density than the first paste, when the paste is placed, the second paste is placed around the first paste in a plan view of the first substrate or the second substrate, and an average particle diameter of the metal nanoparticles in the first paste is in a range of 10 nm and 60 nm, and an average particle diameter of the metal nanoparticles in the second paste is in a range of 60 nm and 100 nm.

5. A projector, comprising:

a light source; and a wavelength conversion section which converts the wavelength of light emitted from the light source, wherein the wavelength conversion section is a joined body in which a first substrate that dissipates heat and a second substrate that has a phosphor are joined to each other with a joining film, the joining film includes a plurality of types of metal nanoparticles, joining film has a first region and a second region, and in a plan view of the first substrate, the first region has a higher metal nanoparticle density than the second region, an average particle diameter of the metal nanoparticles in the first region is in a range of 10 nm and 60 nm, and an average particle diameter of the metal nanoparticles in the second region is in a range of 60 nm and 100 nm, and wherein the first region is disposed in a center of the second substrate in a plan view, and the second region is disposed around the first region.

6. The projector according to claim 5, wherein the joining film projects from at least a part of a periphery of the second substrate in the plan view, and in the second substrate, the joining film is not mounted on an upper face which is a face on an opposite side to the first substrate.

7. The projector according to claim 5, wherein in the first substrate, a first groove is provided along an outer periphery of the first region, and a second groove is provided along an outer periphery of the second region.

* * * * *